(12) United States Patent
Pelley et al.

(10) Patent No.: US 8,861,243 B1
(45) Date of Patent: Oct. 14, 2014

(54) FOUR PORT MEMORY WITH MULTIPLE CORES

(71) Applicants: Perry H. Pelley, Austin, TX (US); Peter J. Wilson, Leander, TX (US)

(72) Inventors: Perry H. Pelley, Austin, TX (US); Peter J. Wilson, Leander, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/873,998

(22) Filed: Apr. 30, 2013

(51) Int. Cl.
*G11C 5/02* (2006.01)
*G11C 5/06* (2006.01)

(52) U.S. Cl.
CPC .............. *G11C 5/025* (2013.01); *G11C 5/063* (2013.01); *G11C 5/02* (2013.01)
USPC ..... 365/51; 365/63; 365/189.02; 365/189.04; 365/230.03; 365/230.05

(58) Field of Classification Search
CPC ............ G11C 5/02; G11C 5/025; G11C 5/05; G11C 5/063
USPC .............. 365/51, 63, 189.02, 189.04, 230.03, 365/230.05
See application file for complete search history.

(56) References Cited

U.S. PATENT DOCUMENTS

| 6,038,627 | A  | * | 3/2000 | Plants | 710/100 |
| 6,504,785 | B1 | * | 1/2003 | Rao | 365/230.05 |
| 7,707,330 | B2 | * | 4/2010 | Rao | 710/38 |

OTHER PUBLICATIONS

Baron, Max, "Tilera's Cores Communicate Better: Mesh Networks and Distributed Memory Reduce Contention Among Cores", Microprocessor Report, Nov. 5, 2007, pp. 1-8.
Glaskowsky, Peter N., "NVIDIA's Fermi: The First Complete GPU Computing Architecture", prepared under contract with NVIDIA Corporation, Sep. 2009.
Wentzlaff, David et al., "On-Chip Interconnection Architecture of the Tile Processor", Micro, IEEE, vol. 27, Issue 5, Sep.-Oct. 2007, pp. 15-31.

* cited by examiner

*Primary Examiner* — Tan T. Nguyen
(74) *Attorney, Agent, or Firm* — Joanna G. Chiu; James L. Clingan, Jr.

(57) ABSTRACT

A memory cluster includes a first block, a second block, a third block, and a fourth block arranged to have a center hole, wherein the first, second, third, and fourth blocks are each have a first port, a second port, a third port, and a fourth port. A first core is in the center hole coupled to the first port of each of the first, second, third, and fourth blocks. A second core is in the center hole coupled to the second port of each of the first, second, third, and fourth blocks. A third core is in the center hole coupled to the third port of each of the first, second, third, and fourth blocks. A fourth core in the center hole coupled to the fourth port of each of the first, second, third, and fourth blocks.

20 Claims, 2 Drawing Sheets

FOUR PORT MEMORY WITH MULTIPLE CORES

BACKGROUND

1. Field

This disclosure relates generally to multi-core data processing systems, and more specifically, to a four-port (4-port) memory with multiple cores.

2. Related Art

In current multi-core technologies, architectures are including an increasing number of smaller cores which allows for a greater flexibility and parallelism. However, each core, regardless of its size, typically has a similar memory requirement. Therefore, a need exists for an architecture which integrates a large number of cores with the required amount of memory for each core.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In accordance with one aspect, a memory cluster includes four 4-port memory blocks arranged to have a center hole, and 4 cores located substantially within the center hole. Each core of the 4 cores can access each of the four 4-port memory blocks by way of vertical buses. Each cluster also includes horizontal buses. An array of these memory clusters may be implemented in which clusters may communicate with each other by way of the vertical and horizontal buses. While a communication is occurring by way of a vertical bus of a cluster with a neighboring cluster, that vertical bus cannot be used for a memory access within the cluster.

Figure 1:
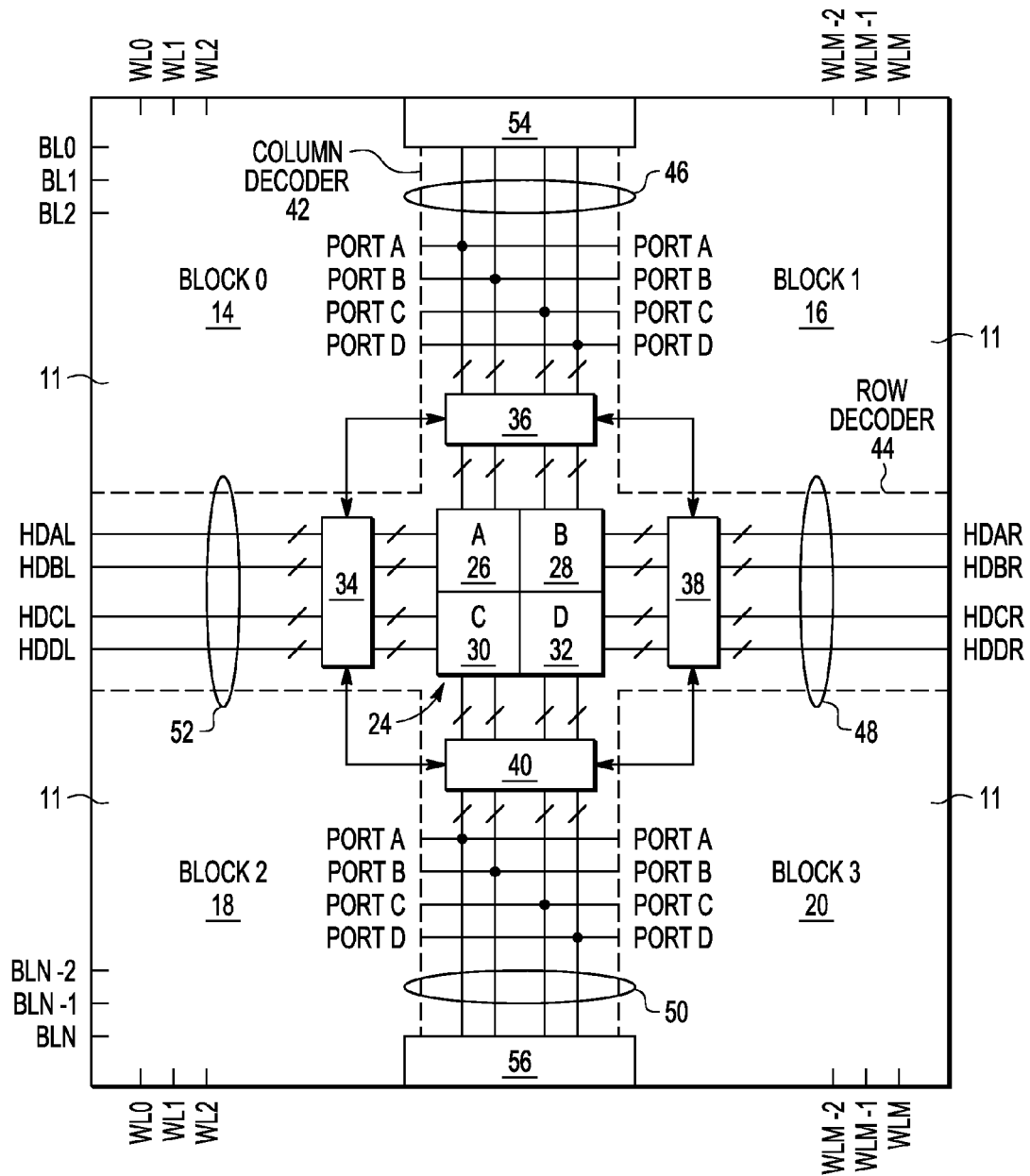
FIG. 1 illustrates, in block diagram form, a cluster having 4 cores and 4 4-port memory blocks, in accordance with one embodiment.

FIG. 1 illustrates, in block diagram form, a memory cluster 12 in accordance with an embodiment. Cluster 12 includes a 4-port memory 11, row decoder circuitry 44, column decoder circuitry 42, switch circuitry 34, 36, 38, 40, 54, and 56, and cores 26, 28, 30, and 32. Memory 11 includes four memory blocks: block 0 14, block 1 16, block 2 18, and block 3 20. A center hole 24 of cluster 12 is defined as a region which surrounds the intersection of a continuous line along row decoder circuitry 44 which crosses cluster 12 and a continuous line along column decoder circuitry 42 which crosses cluster 12. Center hole 24 is defined by blocks 14, 16, 18, and 20. That is, blocks 14, 16, 18, and 20 are arranged to form center hole 24, in which center hole 24 is bounded by lines which are coincident with the inner edges of blocks 14, 16, 18, and 20. Cores 26, 28, 30, and 32 are located substantially within center hole 24, and each core can access each of blocks 14, 16, 18, and 20. Each core can be any type of core or processor and is configured to execute processing instructions. Each core is capable of accessing each block (blocks 14, 16, 18, and 20) of memory 11, as needed, in response to executing the processing instructions. Furthermore, the cores can simultaneously execute independent instruction streams.

Each block of memory 11 includes 4 ports: Port A, Port B, Port C, and Port D. Therefore, each memory block of memory 11 can simultaneously process 4 read/write access requests, one on each of ports A, B, C, and D. However, under certain conditions, in order to simultaneously process 4 access requests, stalls may be incurred. Alternatively, each memory block may include circuitry to handle conflicts between the 4 access requests so as to reduce or eliminate stalls.

Still referring to FIG. 1, memory 11 includes N+1 bit line pairs BL0-BLN and M+1 word lines WL0-WLM. A memory cell of memory 11 is located at each intersection of a bit line pair and a word line. The memory cell is accessed, for a read or write, by activating the appropriate word line and sensing or driving the appropriate intersecting bit lines. During an access of memory 11, row decoder 44 decodes the row address portion of the corresponding access address and activates the addressed word line of WL0-WLM, and column decoder 42 decodes the column address portion of the corresponding access address and senses or drives the addressed bit lines. In some embodiments, bit line pairs BL0-BLN may include separate bit line pairs in each of blocks 14, 16, 18, and 20. In the illustrated embodiment, memory 11 is separated into 4 blocks, in which a first portion of the bit line pairs is used to access blocks 14 and 16, and a second portion of the bit line pairs is used to access blocks 18 and 20. Similarly, a first portion of the word lines is used to access blocks 14 and 18, and a second portion of the word lines is used to access blocks 16 and 20. Row decoder circuitry 44 is located between blocks 14 and 18 and between blocks 16 and 20, and is generally not within center hole 24. Column decoder circuitry 42 is located between blocks 14 and 16 and between blocks 18 and 20, and is generally not within center hole 24. In one embodiment, each of blocks 14, 16, 18, and 20 is equal in size. However, they may be different in size dependant, for example, on their use. In the illustrated embodiment, the word lines WL0-WLM run substantially parallel to the continuous line along column decoder 42 and substantially perpendicular to the continuous line along row decoder 44. The bit line pairs BL0-BLN run substantially parallel to the continuous line along row decoder 44 and substantially perpendicular to the continuous line along column decoder 42.

In one embodiment, each of blocks 14, 16, 18, and 20 operate as a level 1 (L1) cache for cores 26, 28, 30, and 32. Furthermore, each block may operate as a data cache or an instruction cache. Each cache can, in one embodiment, be shared by the four cores within center hole 24. Each of core A 26, core B 28, core C 30, and core D 30 can access each block of memory 11. Each core specifically accesses each memory block through a specific one of its 4 ports. For example, core A 26 can access block 14 by way of port A of block 14, block 16 by way of port A of block 16, block 18 by way of port A of block 18, and block 20 by way of port A of block 20. Core B 28 can access block 14 by way of port B of block 14, block 16 by way of port B of block 16, block 18 by way of port B of block 18, and block 20 by way of port B of block 20. Core C 30 can access block 14 by way of port C of block 14, block 16 by way of port C of block 16, block 18 by way of port C of block 18, and block 20 by way of port C of block 20. Core D can access block 14 by way of port D of block 14, block 16 by way of port D of block 16, block 18 by way of port D of block 18, and block 20 by way of port D of block 20.

Cluster 12 includes a bidirectional vertical bus 46 between blocks 14 and 16 which extends from center hole 24 to a first location of a perimeter of cluster 12. Bus 46 is coupled to switch circuitry 54 located at the first location of the perimeter of cluster 12. Cluster 12 includes switch circuitry 36 coupled between vertical bus 46 and cores A, B, C, and D. Bus 46 provides connections between each of cores A, B, C, and D and ports A, B, C, and D of blocks 14 and 16 through switch circuitry 36. Therefore, cores A, B, C, and D utilize bus 46 to communicate with blocks 14 and 16 of memory 11. Cluster 12 includes a bidirectional vertical bus 50 between blocks 18 and 20 which extends from center hole 24 to a second location of a perimeter of cluster 12. Bus 50 is coupled to switch circuitry 56 located at the second location of the perimeter of cluster 12. Cluster 12 includes switch circuitry 40 coupled between vertical bus 50 and cores A, B, C, and D. Bus 50 provides connections between each of cores A, B, C, and D and ports A, B, C, and D of blocks 18 and 20 through switch circuitry 40. Therefore, cores A, B, C, and D utilize bus 50 to communicate with blocks 18 and 20 of memory 11. Switch circuitry 54 and switch circuitry 56 are located opposite each other along the perimeter of cluster 12. The word lines (WL0-WLM) run substantially parallel to vertical buses 46 and 50. When cores A, B, C, and D are communicating with blocks 14 and 16, switch circuitry 40 may prevent bus 50 from being driven in order to save power. Similarly, when cores A, B, C, and D are communicating with blocks 18 and 20, switch circuitry 36 may prevent bus 46 from being driven in order to save power.

Included within each of buses 46 and 50 may be data signals, address signals, and control signals. Some or all of these signals may be communicated external to cluster 12 by way of switching circuitry 54 and 56. Also, buses 46 and 50 extend from center hole 24 and run through the regions of memory 11 containing column decoder 42. As will be described in more detail below in reference to FIG. 2, cluster 12 may communicate with other clusters. In this case, signals may be communicated external to cluster 12. Vertical busses 46 and 50 may be used to allow any of core A, B, C, and D to communicate with memory or cores of a neighboring cluster located above or below cluster 12. However, when vertical bus 46 is being used to communicate information, through switching circuitry 54, to another cluster external to cluster 12, a portion or all of vertical bus 46 is not used to perform memory accesses to block 14 or block 16. Similarly, when vertical bus 50 is being used to communicate information, through switching circuitry 56, to another cluster external to cluster 12, a portion or all of vertical bus 50 is not used to perform memory accesses to block 18 or 20. Therefore, note that during communication with other clusters through either vertical bus 46 or vertical bus 50, all or portions of the vertical bus being used to perform the communication are precluded from performing memory accesses during the communication. In some embodiments, a portion of buses 46 and 50 may be allocated for communication between each processor and its associated memory port. In some embodiments, a portion of buses 46 and 50 previously assigned to a port of memory 11 may be reassigned to communication with another cluster.

Cluster 12 also includes a bidirectional horizontal bus 52 between blocks 14 and 18 which extends from center hole 24 to a third location of the perimeter of cluster 12. Cluster 12 also includes switch circuitry 34 coupled between horizontal bus 52 and cores A, B, C, and D. As mentioned above, cluster 12 is able to communicate with other clusters, therefore, bus 50 provides communication to a cluster neighboring cluster 12 on the left side. Cluster 12 includes a bidirectional horizontally bus 48 between blocks 16 and 20 which extends from center hole 24 to a fourth location of the perimeter of cluster 12. Note that the third and fourth locations may be opposite each other along the perimeter of cluster 12. Cluster 12 includes switch circuitry 38 coupled between horizontal bus 48 and cores A, B, C, and D. Bus 48 provides communication to a cluster neighboring cluster 12 on the right side. Note that when communications are occurring on bus 52 to a cluster external to cluster 12, switch circuitry 38 may prevent bus 48 from being driven in order to save power. Similarly, when communications are occurring on bus 48 to a cluster external to cluster 12, switch circuitry 34 may prevent bus 52 from being driven in order to save power.

Included within each of buses 48 and 52 may be data signals, address signals, and control signals. Also, buses 48 and 52 extend from center hole 24 and run through the regions of memory 11 containing row decoder 44. Note that switch circuitry 34, 36, 38, and 40 may be located within center hole 24, or may be located external to center hole 24, between blocks of memory 11.

Note that although buses 48 and 52 are referred to as horizontal buses and buses 46 and 50 are referred to as vertical buses, these names are used to provide their relative orientation. Also, in an alternate embodiment, the horizontal buses, rather than the vertical buses, may be used for communication between the cores and memory blocks of a cluster, in which the same horizontal buses may then be used for communication with neighboring clusters.

Figure 2:
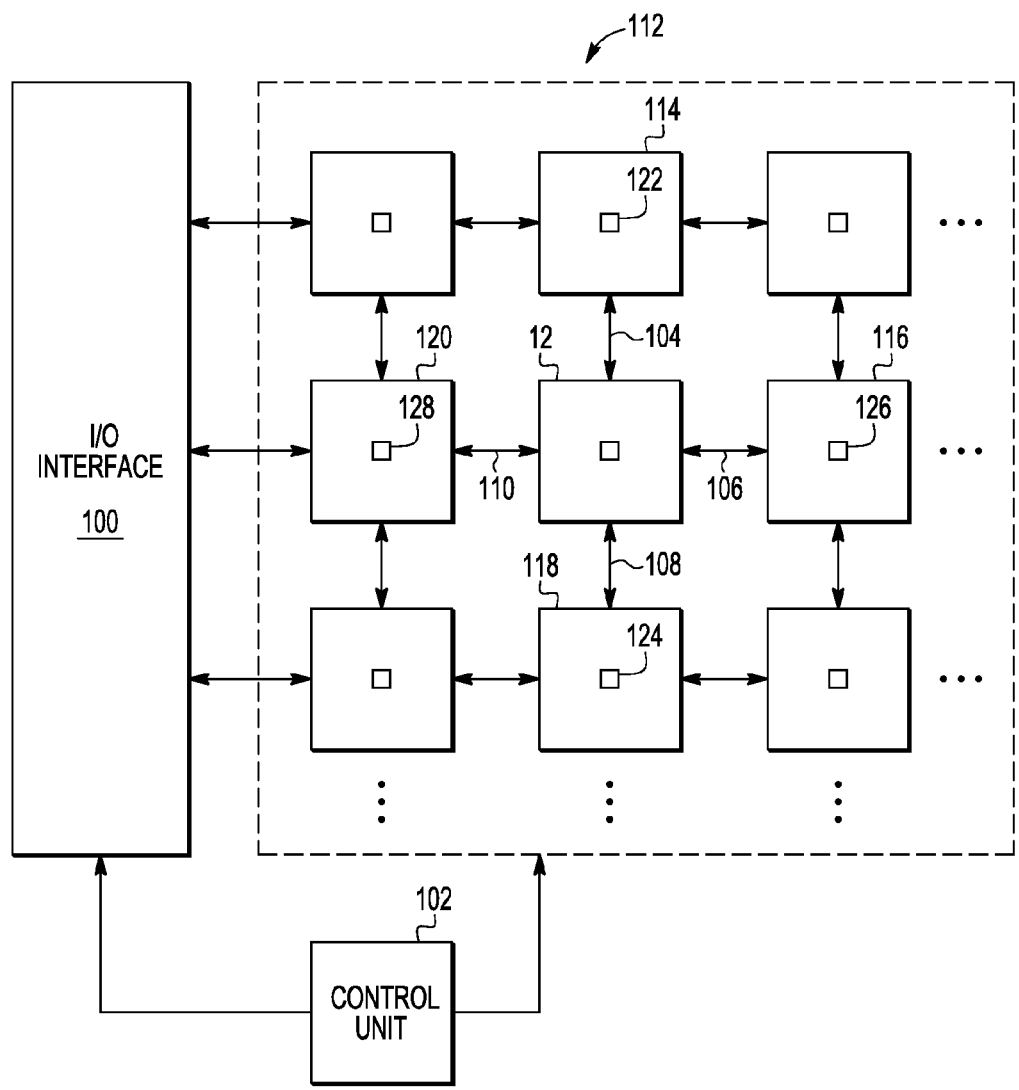
FIG. 2 illustrates, in block diagram form, a multi-core data processing system having an array of clusters, such as the cluster of FIG. 1, in accordance with one embodiment.

FIG. 2 illustrates a system 10 including an array 112 of clusters, an I/O interface 100 coupled to array 112, and a control unit 102. Array 112 may include any number of clusters. Cluster 12 of FIG. 1 is one exemplary cluster of array 112. The other clusters in array 112 can be configured like cluster 12. Each cluster of array 112 includes a corresponding center hole, and corresponding vertical and horizontal buses analogous to those described in reference to cluster 12. Also, each cluster includes 4 cores within its center hole, and four 4-port memory blocks capable of communicating with each of the 4 cores. Each cluster of array 112 is coupled to its neighboring cluster by way of a bidirectional bus. For example, referring to cluster 12, cluster 12 can communicate signals with cluster 114 by way of bus 104. Therefore, vertical bus 50 of FIG. 1 may be coupled to bus 104, as needed, by switch circuitry 54, and a vertical bus of cluster 114 which extends from center hole 122 of cluster 114 down to bus 104 may also be coupled to bus 104 by corresponding switch circuitry of cluster 114. Cluster 12 can communicate signals with cluster 118 by way of bus 108. Therefore, vertical bus 46 of FIG. 1 may be coupled to bus 108 by way of switch circuitry 56, and a vertical bus of cluster 118 which extends from center hole 124 of cluster 118 may also be coupled to bus 108 by corresponding switch circuitry of cluster 118. Cluster 12 can communicate signals with cluster 116 by way of bus 106. Therefore, horizontal bus 48 of FIG. 1 may be coupled to bus 106, and bus 106 may be coupled to a horizontal bus of cluster 116 which extends from center hole 126 of cluster 116. Cluster 12 can communicate signals with cluster 120 by way of bus 110. Therefore, horizontal bus 52 of FIG. 1 may be coupled to bus 110, and bus 110 may be coupled to a horizontal bus of cluster 120 which extends from center hole 128 of cluster 120.

In one embodiment, control unit 102 creates a mapping of array 112 such that each memory of each cluster in array 112 can be accessed. In one example, each cluster is assigned a cluster number which is used by switch circuitry (such as switch circuitry 34, 36, 38, and 40) to route signals to the appropriate clusters. The cluster number may be provided as part of the access address of an access request by the requesting core of array 112. Therefore, a core within cluster 12 can access a memory of any other cluster. Additionally, the memory and each processor within a cluster may have an identifier (ID) which allows each element of the cluster to be individually addressed and accessed. Each access may be routed to neighboring clusters, as needed, to reach the appropriately addressed cluster. Therefore, note that multiple clusters may need to be traversed in order to reach a destination. Switch circuitry within a cluster, such as switch circuitry 34, 36, 38, and 40, may communicate with each other in order to appropriately route requests, such as to appropriately direct requests either horizontally to a next cluster or vertically to a next cluster, as needed. In some embodiments, control unit 102 may control the switch circuitry. Furthermore, by having the switch circuitry route the requests, when a core of one cluster requests access to a memory of a different cluster, a core of that different cluster need not be used to perform the access. Also, a core of one cluster may send a processor command directly to a core of another cluster, in which the core address may be used to specify the other cluster. This processor command may be, for example, an interrupt. A processor command may therefore include a command type and a core ID to identify the appropriate core.

In one embodiment, control unit 102 can be implemented by one of the cores within a memory cluster of array 112. Also, each core may communicate with I/O interface 100, as needed, to access circuitry external to array 112 (such as external memories, peripherals, etc.). A traversal through one or more clusters may be performed in order for a request to reach I/O interface 100. In one embodiment, system 10 is implemented within a single integrated circuit.

Therefore, by now there has been appreciated how a memory cluster having four cores and four 4-port memory blocks may be used to allow for efficient placement of numerous cores and corresponding memories. Furthermore, these memory clusters may be implemented as an array for increased flexibility and placement efficiency.

As used herein, the term "bus" is used to refer to a plurality of signals or conductors which may be used to transfer one or more various types of information, such as data, addresses, control, or status. The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under", and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, each horizontal or vertical bus may communicate greater, fewer, or different types of signals. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

Item 1 includes a memory cluster including a first block, a second block, a third block, and a fourth block arranged to have a center hole, wherein the first, second, third, and fourth blocks are each have a first port, a second port, a third port, and a fourth port; a first core in the center hole coupled to the first port of each of the first, second, third, and fourth blocks; a second core in the center hole coupled to the second port of each of the first, second, third, and fourth blocks; a third core in the center hole coupled to the third port of each of the first, second, third, and fourth blocks; and a fourth core in the center hole coupled to the fourth port of each of the first, second, third, and fourth blocks. Item 2 includes the memory cluster of item 1, and further includes a first vertical bus between the first and second blocks extending from the center hole to a first location of a perimeter of the memory cluster, wherein the first block includes word lines running parallel with the first vertical bus. Item 3 includes the memory cluster of item 2, and further includes a second vertical bus between the third and fourth blocks extending from the center hole to a second location of the perimeter of the memory cluster. Item 4 includes the memory cluster of item 3, and further includes a first horizontal bus between the first and fourth blocks extending from the center hole to a third location of the perimeter of the memory cluster, wherein the first block comprises bit lines running parallel with the first horizontal bus; and a second horizontal bus between the second and third blocks extending from the center hole to a fourth location of the perimeter of the memory cluster. Item 5 includes the memory cluster of item 2, and further includes a first switch coupled to the first vertical bus at the first location of the perimeter. Item 6 includes the memory cluster of item 5, and further includes a second switch coupled between the first core and the first vertical bus at the center hole. Item 7 includes a system which includes the memory cluster of item 2, and the system further includes a second memory cluster coupled to the first vertical bus. Item 8 includes the system of item 7, wherein the first vertical bus is used to run memory accesses by the second memory cluster on the first block. Item 9 includes the system of item 7, wherein the first vertical bus is used by the second memory cluster to run processor accesses using the first core. Item 10 includes an array of memory clusters including the memory cluster of item 1, wherein each memory cluster comprises four blocks that are each four-port and a center hole having four cores wherein the memory clusters are interconnected by a plurality of vertical and horizontal buses.

Item 11 includes a method, including providing a memory cluster having four cores and four blocks, wherein each of the four blocks is four-port; and performing accesses simultaneously to the four blocks from four cores located in a center hole defined by the four blocks. Item 12 includes the method of item 11, and further includes performing a processor access to a selected core of the four cores, initiated externally from the memory cluster, through a bus running from a perimeter of the memory cluster to the center hole. Item 13 includes the method of item 11, and further includes performing a memory access to a selected core of the four cores, initiated externally from the memory cluster, through a bus running from a perimeter of the memory cluster to the center hole.

Item 14 includes a cluster including a memory having a first block, a second block, a third block, and a fourth block arranged to have center hole, where the first, second, third, and fourth blocks have a first port, a second port, a third port, and a fourth port; and a first core coupled to the first port, a second core coupled to the second port, a third core coupled to the third port, and a fourth core coupled to the fourth port, wherein the first, second, third, and fourth cores are in the center hole. Item 15 includes the cluster of item 14, wherein the first, second, third, and fourth cores can perform accesses simultaneously to the memory. Item 16 includes the cluster of item 14, wherein the memory includes a plurality of word lines running vertically; a first vertical bus and a second vertical bus running parallel with the plurality of word lines; wherein the first, second, third, and fourth cores are coupled to the first and second vertical buses. Item 17 includes the cluster of item 16, and further includes a plurality of bit lines running horizontally; and a first horizontal bus and a second horizontal bus running parallel with the plurality of bit lines; wherein the first, second, third, and fourth cores are coupled to the first and second horizontal buses. Item 18 includes the cluster of item 17, and further includes a first switch coupled between the first vertical bus and the first, second, third, and fourth cores at the center hole; and a second switch coupled to the first vertical bus at a perimeter of the memory. Item 19 includes the cluster of item 18, and further includes a third switch coupled between the first horizontal bus and the second switch and the first, second, third, and fourth cores at the center hole. Item 20 includes a system including the cluster of item 17, wherein the first horizontal bus and the first vertical bus are for running one of a group consisting of a processor access and a memory access.

What is claimed is:

1. A memory cluster, comprising:
a first block, a second block, a third block, and a fourth block arranged to have a center hole, wherein the first, second, third, and fourth blocks are each have a first port, a second port, a third port, and a fourth port;
a first core in the center hole coupled to the first port of each of the first, second, third, and fourth blocks;
a second core in the center hole coupled to the second port of each of the first, second, third, and fourth blocks;
a third core in the center hole coupled to the third port of each of the first, second, third, and fourth blocks; and
a fourth core in the center hole coupled to the fourth port of each of the first, second, third, and fourth blocks.

2. The memory cluster of claim 1, further comprising:
a first vertical bus between the first and second blocks extending from the center hole to a first location of a perimeter of the memory cluster, wherein the first block comprises word lines running parallel with the first vertical bus.

3. The memory cluster of claim 2, further comprising:
a second vertical bus between the third and fourth blocks extending from the center hole to a second location of the perimeter of the memory cluster.

4. The memory cluster of claim 3, further comprising:
a first horizontal bus between the first and fourth blocks extending from the center hole to a third location of the perimeter of the memory cluster, wherein the first block comprises bit lines running parallel with the first horizontal bus; and
a second horizontal bus between the second and third blocks extending from the center hole to a fourth location of the perimeter of the memory cluster.

5. The memory cluster of claim 2, further comprising a first switch coupled to the first vertical bus at the first location of the perimeter.

6. The memory cluster of claim 5, further comprising a second switch coupled between the first core and the first vertical bus at the center hole.

7. A system comprising the memory cluster of claim 2, the system further comprising a second memory cluster coupled to the first vertical bus.

8. The system of claim 7, wherein the first vertical bus is used to run memory accesses by the second memory cluster on the first block.

9. The system of claim 7, wherein the first vertical bus is used by the second memory cluster to run processor accesses using the first core.

10. An array of memory clusters including the memory cluster of claim 1, wherein each memory cluster comprises four blocks that are each four-port and a center hole having four cores wherein the memory clusters are interconnected by a plurality of vertical and horizontal buses.

11. A method, comprising:
providing a memory cluster having four cores and four blocks, wherein each of the four blocks is four-port; and
performing accesses simultaneously to the four blocks from four cores located in a center hole defined by the four blocks.

12. The method of claim 11, further comprising:
performing a processor access to a selected core of the four cores, initiated externally from the memory cluster, through a bus running from a perimeter of the memory cluster to the center hole.

13. The method of claim 11, performing a memory access to a selected core of the four cores, initiated externally from the memory cluster, through a bus running from a perimeter of the memory cluster to the center hole.

14. A cluster, comprising:
a memory comprising a first block, a second block, a third block, and a fourth block arranged to have center hole, where the first, second, third, and fourth blocks have a first port, a second port, a third port, and a fourth port; and a first core coupled to the first port, a second core coupled to the second port, a third core coupled to the third port, and a fourth core coupled to the fourth port, wherein the first, second, third, and fourth cores are in the center hole.

15. The cluster of claim 14, wherein the first, second, third, and fourth cores can perform accesses simultaneously to the memory.

16. The cluster of claim 14, wherein the memory comprises:
   a plurality of word lines running vertically;
   a first vertical bus and a second vertical bus running parallel with the plurality of word lines;
   wherein the first, second, third, and fourth cores are coupled to the first and second vertical buses.

17. The cluster of claim 16, further comprising:
   a plurality of bit lines running horizontally; and
   a first horizontal bus and a second horizontal bus running parallel with the plurality of bit lines;
   wherein the first, second, third, and fourth cores are coupled to the first and second horizontal buses.

18. The cluster of claim 17, further comprising:
   a first switch coupled between the first vertical bus and the first, second, third, and fourth cores at the center hole; and
   a second switch coupled to the first vertical bus at a perimeter of the memory.

19. The cluster of claim 18, further comprising a third switch coupled between the first horizontal bus and the second switch and the first, second, third, and fourth cores at the center hole.

20. A system comprising the cluster of claim 17 wherein the first horizontal bus and the first vertical bus are for running one of a group consisting of a processor access and a memory access.

* * * * *